(12) United States Patent
Sacco et al.

(10) Patent No.: US 6,456,150 B1
(45) Date of Patent: Sep. 24, 2002

(54) CIRCUIT FOR BIASING A BULK TERMINAL OF A MOS TRANSISTOR

(75) Inventors: Andrea Sacco, Alessandria; Rino Micheloni, Turate; Marco Scotti, Sesto San Giovanni, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/661,601

(22) Filed: Sep. 14, 2000

(30) Foreign Application Priority Data

Sep. 17, 1999 (IT) .......................................... TO99A0798

(51) Int. Cl.[7] ................................................ H03K 3/01

(52) U.S. Cl. ....................................... 327/534; 327/535

(58) Field of Search ................................. 327/535, 534, 327/537, 562, 108; 326/81

(56) References Cited

U.S. PATENT DOCUMENTS

| 5,444,397 | A | * | 8/1995 | Wong et al. | .................... 326/81 |
| 5,719,525 | A | * | 2/1998 | Khoury | ...................... 327/562 |
| 5,990,705 | A | * | 11/1999 | Lim | ............................. 326/81 |
| 6,208,178 | B1 | * | 3/2001 | Chen | ........................... 327/108 |

* cited by examiner

*Primary Examiner*—Tuan T. Lam
*Assistant Examiner*—Hiep Nguyen
(74) *Attorney, Agent, or Firm*—Lisa K. Jorgenson; Timothy L. Boller; Seed IP Law Group PLLC

(57) ABSTRACT

A circuit for biasing the bulk terminal of a first MOS transistor having a first terminal connected to a first line set to a first potential, and a second terminal connected to a second line set to a second potential. The biasing circuit includes a second and a third MOS transistors having first terminals connected respectively to the first line and to the second line, second terminals connected to the bulk terminal of the first MOS transistor, and control terminals connected respectively to the second and to the first line.

20 Claims, 2 Drawing Sheets

CIRCUIT FOR BIASING A BULK TERMINAL OF A MOS TRANSISTOR

TECHNICAL FIELD

The present invention relates to a circuit for biasing a bulk terminal of a MOS transistor.

BACKGROUND OF THE INVENTION

As is known, in order to guarantee correct functioning of a MOS transistor in all operative conditions, it is necessary for the PN junctions present between the bulk region and the drain and source regions of the MOS transistor always to be biased inversely. In order to guarantee this inverse biasing, the bulk terminal of a PMOS transistor is always biased to the highest potential present in the circuit in which the PMOS transistor is inserted, whereas the bulk terminal of an NMOS transistor is biased to the lowest potential.

This condition must always be fulfilled, otherwise there is a risk that the said PN junctions will be biased directly, thus triggering so-called latch-up phenomena, i.e., the phenomena of conduction of parasitic components.

In some cases, however, the aforementioned condition is not simple to obtain, particularly when the potential to which the bulk terminal must be biased is not known a priori, but depends on the operating condition of the MOS transistor.

A typical example of this situation is obtained when the MOS transistor is used bi-directionally, i.e., when its source and drain terminals can change roles, depending on the direction of the current. In fact, in this case, if it is not possible to bias the bulk terminal to a potential which is always higher than the potentials of the drain and source terminals, there is a risk of direct biasing of the PN junctions, with the aforementioned consequences.

FIG. 1 illustrates by way of example a circuit in which there can be seen the undesirable situation of direct biasing of the PN junctions present between the bulk region and the drain and source regions of a PMOS transistor.

In particular, FIG. 1 shows a first PMOS transistor 1 having a first terminal 1a connected to a first line 2 set to a first potential V1, a second terminal 1b, a bulk terminal 1c connected to a second line 4 set to a second potential V2, and a gate terminal 1d receiving a first control signal SC, with high and low logic levels defined respectively by the second potential V2 and the ground potential, and which control respectively switching on and switching off of the PMOS transistor 1.

In the example considered in FIG. 1, the second line 4 is connected to the output of a charge pump (not shown) which, when it is on, provides a potential VHV which is greater than the first potential V1, and is controlled by the first control signal SC in phase opposition with respect to the PMOS transistor 1. In particular, when the PMOS transistor 1 is on, and connects to one another the first and the second line 2, 4, the charge pump is off, and thus the second potential V2 is substantially equivalent to the first potential V1 (minus the voltage drop across the PMOS transistor 1). Whereas when the PMOS transistor 1 is off, the charge pump is on, and thus the second potential V2 is greater than the first potential V1. In addition, in some applications, when the PMOS transistor 1 is off, the charge pump could also be off, and the second line 4 could be biased to a potential which is different from those described.

In the circuit in FIG. 1, direct biasing of the PN junctions present between the bulk region and the drain and source regions of the first PMOS transistor 1 can occur if the second potential V2 drops below the first potential V1, as a result of an overload or specific operating requirements, by a quantity which is greater than the threshold voltage of a PN junction. In fact, in this case, the bulk terminal 1c of the first PMOS transistor 1 would be biased to a potential lower than the potential of the first terminal 1a of the PMOS transistor 1 itself, by a quantity which is greater than the threshold voltage of a PN junction, and thus the PN junction defined by the regions connected to the bulk terminal 1c, and to the first terminal 1a, would be biased directly, with the aforementioned consequences.

A known circuit solution, which in the above-described example makes it possible always to guarantee the inverse biasing of the PN junctions in any operating condition, is illustrated in FIG. 2.

According to this solution, between the first PMOS transistor 1 and the first line 2, there is interposed a second PMOS transistor 6, which is provided in a different tub from that in which the first PMOS transistor 1 is provided, and has a first terminal 6a connected to the first line 2, a second terminal 6b connected to the first terminal 1a of the first PMOS transistor 1, a bulk terminal 6c connected to the second line 4, and a gate terminal 6d receiving a second control signal SB, which has high and low logic levels defined respectively by the first potential V1 and by the ground potential, and which control respectively switching on and switching off of the PMOS transistor 6.

In the circuit in FIG. 2, direct biasing cannot occur of the PN junctions which are present between the bulk region and the drain and source regions of the first and second PMOS transistor 1, 6, since, when the PMOS transistors 1, 6 are off, their bulk terminals 1c, 6c are biased respectively to the first and second potential V1, V2, and are therefore never biased to potentials which are lower than the potentials to which the other two terminals, respectively 1a, 1b and 6a, 6b, are biased.

However, the above-described circuit solution has the disadvantage that the two PMOS transistors 1, 6 have rather large dimensions, and consequently the silicon area which they occupy, derived from implementation of this solution, is rather large.

SUMMARY OF THE INVENTION

The disclosed embodiments of the present invention provide a circuit for biasing the bulk terminal of a transistor, free from the disadvantages of the above-described solutions.

According to the disclosed embodiments of the present invention, a circuit is provided for biasing a bulk terminal of a MOS transistor, the transistor having a first terminal connected to a first line set to a first potential and a second terminal connected to a second line set to a second potential. The biasing circuit in accordance with one embodiment of the invention includes a second and a third MOS transistor having first terminals connected respectively to the first line and to the second line, second terminals connected to the bulk terminal of the MOS transistor, and control terminals connected respectively to the second and to the first line.

In accordance with another aspect of the present invention, the second and third MOS transistors have bulk terminals connected to the bulk terminal of the first MOS transistor.

In accordance with yet another embodiment of the present invention, the biasing circuit further includes a fourth MOS transistor having a first terminal connected to one from among the first and second notes, a second terminal coupled to the bulk terminal of the first MOS transistor, and a control terminal receiving a first control signal. Ideally the MOS transistor has a bulk terminal connected to the bulk terminal of the first MOS transistor.

In accordance with still yet another aspect of the present invention, the circuit further includes a fifth MOS transistor having a first terminal coupled to one from among the second node and a ground node, a second terminal connected to the bulk terminal of the first MOS transistor, and a control terminal receiving a second control signal. Ideally the fifth MOS transistor has a bulk terminal connected to the bulk terminal of the MOS transistor.

BRIEF DESCRIPTION OF THE DRAWINGS

In order to assist understanding of the present invention, two preferred embodiments are now described, purely by way of non-limiting example, and with reference to the attached drawings, in which.

DETAILED DESCRIPTION OF THE INVENTION

Figure 3:
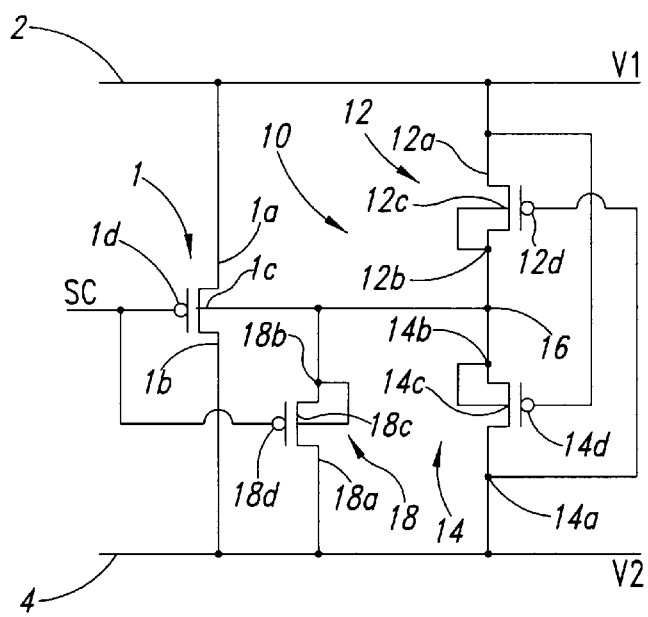
FIG. 3 shows a circuit solution according to the present invention, which an prevent the PN junctions from being biased directly in a PMOS transistor.

In FIG. 3, 10 indicates as a whole a circuit for biasing the bulk terminal of a first PMOS transistor 1.

The biasing circuit 10 comprises a second and a third PMOS transistor 12, 14 series-connected between the first and the second line 2, 4, and in particular having first terminals 12a, 14a connected respectively to the first line 2 and to the second line 4, second terminals 12b, 14b connected to one another, and defining an output node 16 connected to the bulk terminal 1c of the first PMOS transistor 1, bulk terminals 12c, 14c connected to the output node 16, and gate terminals 12d, 14d connected respectively to the second line 4 and to the first line 2.

The biasing circuit 10 further comprises a fourth PMOS transistor 18 having a first terminal 18a connected to the second line 4, a second terminal 18b, a bulk terminal 18c connected to the output node 16, and a gate terminal 18d connected to the gate terminal 1d of the first PMOS transistor 1.

Figure 2:
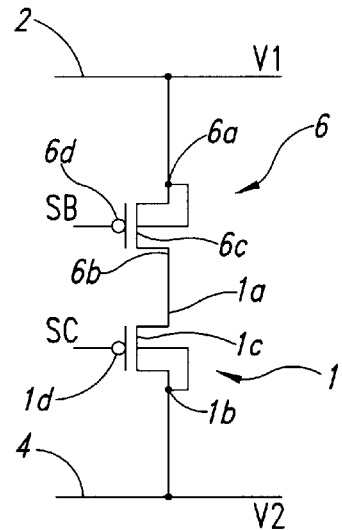
FIG. 2 shows a known circuit solution which can prevent the PN junctions from being biased directly in a PMOS transistor.

In addition, in the biasing circuit 10, a single one of the PMOS transistors, in particular the PMOS transistor 1, has a high form ratio, and thus occupies a large silicon area, instead of the two transistors (PMOS 1 and 6) required by the conventional solution previously described with reference to FIG. 2, whereas the other PMOS transistors, in particular the PMOS transistors 12, 14 and 18, can have reduced dimensions.

The embodiment of the biasing circuit 10 thus permits a considerable saving of silicon area, compared with the conventional solution previously described.

The biasing circuit 10 functions as follows. It is assumed that the PMOS transistors 1 and 18 are off. If the second potential V2 is greater than the first potential V1, by a quantity which is at least equivalent to the threshold voltage VTH1 of a PMOS transistor, i.e., V2>V1+VTH1, the PMOS transistor 14 is on, whereas the PMOS transistor 12 is off. Thus, the output node 16, and therefore the bulk terminal 1c of the PMOS transistor 1 which is connected to it, is biased to the second potential V2, which is the highest potential present in the circuit in this situation.

If, on the other hand, the second potential V2 is smaller than the first potential V1, by a quantity which is at least equivalent to the threshold voltage VTH1, i.e., V2<V1−VTH1, the PMOS transistor 14 is off, whereas the PMOS transistor 12 is on. Thus, the output node 16, and therefore the bulk terminal 1c of the PMOS transistor 1 which is connected to it, is biased to the first potential V1, which is the highest potential present in the circuit in this situation.

On the other hand, when the difference in absolute value between the first and the second potential V1, V2 is smaller than the threshold voltage VTH1, i.e., |V2−V1|<VTH1, both the PMOS transistor 12 and the PMOS transistor 14 are off, and the output node 16, and therefore the bulk terminal 1c of the PMOS transistor 1, is floating.

In these conditions, the bulk terminal 1c of the PMOS transistor 1 will tend to go to a potential which is equivalent to the greater from amongst the potentials V1 and V2, minus the threshold voltage of a PN junction.

If the condition of indeterminateness of the potential of the bulk terminal 1c of the PMOS transistor 1 is unacceptable, and it is wished to make the second potential V2 conditional on the first potential V1, it is sufficient to switch on both the PMOS transistor 1 and the PMOS transistor 18.

In this situation, the first and the second lines 2, 4 are connected to one another via the PMOS transistor 1, whereas the output node 16 is connected to the second line 4 via the PMOS transistor 18. Consequently, the output node 16 is biased to the second potential V2, which assumes a value which is substantially equivalent to that of the first potential V1.

Correct biasing of the bulk terminal 1c of the PMOS transistor 1 is guaranteed by the biasing circuit 10, not only in the above-described static conditions, but also in dynamic conditions.

In fact, if the second potential V2 of the second line 4 is at a value greater than, or equivalent to V1+VTH1, and it is suddenly taken to a value lower than, or equivalent to V1−VTH1, instantaneous switching of the PMOS transistors 12, 14 would guarantee instantaneous variation of the biasing of the bulk terminal 1c of the PMOS transistor 1, from the second potential V2 to the first potential V1.

At the same time, the PMOS transistors 1 and 18, with the first terminals 1a, 18a and the bulk terminals 1c, 18c biased to the first potential V1, and the second terminals 1b, 18b and the gate terminals 1d, 18d biased to a potential equivalent to V1−VTH1, would switch on, thus connecting the second line 4 to the first line 2, and therefore in substance opposing a decrease in the second potential V2 to below the first potential V1, minus the threshold voltage VTH1.

Figure 4:
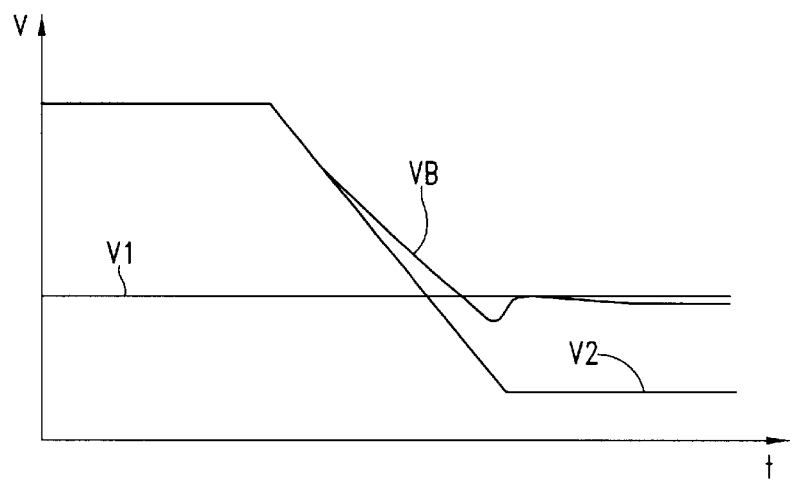
FIG. 4 shows the patterns of some electrical quantities of the circuit in FIG. 3.

The above-described limitation effect is shown in FIG. 4, which shows the patterns of the first and second potential V1, V2, and of the potential VB of the bulk terminal 1c of the PMOS transistor 1, obtained by simulating a sudden drop in the second potential V2.

As can be seen by analyzing FIG. 4, a sudden drop in the second potential V2, starting from a greater value of the first potential V1, corresponds initially to a similar decrease in the potential VB at the bulk terminal 1c of the PMOS transistor 1. However, when the second potential V2 is equivalent to the first potential V1, minus the threshold voltage VTH1, both the PMOS transistor 1 and the PMOS transistor 12 switch on; thus, the PMOS transistor 1 sets the second potential V2 to the value of the first potential V1 minus VTH1, whereas the PMOS transistor 12 sets the value of the potential VB of the bulk terminal 1c of the PMOS transistor 1 to the first potential V1.

A similar process to that applied for correct biasing of the bulk terminal of a PMOS transistor can also be applied to an NMOS transistor, wherein the bulk terminal must be biased, as is known, to the lowest potential present in the circuit in which the NMOS transistor is inserted.

Figure 5:
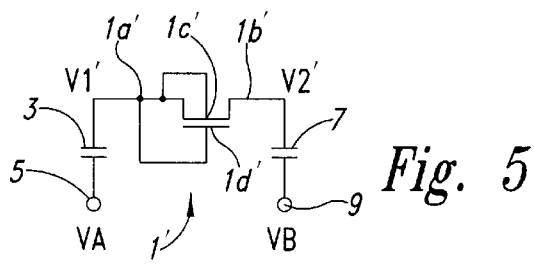
FIG. 5 shows a circuit comprising an NMOS transistor, in which the PN junctions present between the bulk region and the drain and source regions of the NMOS transistor can be biased directly in some operating conditions.

FIG. 5 illustrates by way of example a circuit in which there can be seen the undesirable situation of direct biasing of the PN junctions present between the bulk region and the drain and source regions of an NMOS transistor.

In particular, FIG. 5 shows a first NMOS transistor 1', which is part of a charge pump, and has a first terminal 1a' connected via a first capacitor 3, to a first terminal 5 set to a potential VA; a second terminal 1b' connected via a second capacitor 7 to a second terminal 9 set to a potential VB; and a bulk terminal 1c' and a gate terminal 1d' which are connected to the first terminal 1a' of the first NMOS transistor 1'.

The circuit in FIG. 5 functions in a known manner, and it is therefore described hereinafter only to the extent necessary in order to understand the problem underlying the present invention.

In use, the potentials VA and VB vary in phase opposition with respect to one another, between a zero value and a value VDD, whereas the voltages across the first and the second capacitor 3, 7 assume values other than zero; in particular, hereinafter in the description, the voltage across the first capacitor 3 will be indicated as VC1, whereas the voltage across the second capacitor 7 will be indicated as VC2. As can easily be appreciated from simple analysis of the circuit, in use the voltage VC2 across the second capacitor 7 is equivalent to VC2=VC1+VDD−VTH2, wherein VTH2 is the threshold voltage of a PN junction.

When the first potential VA is equivalent to VDD, and the potential VB is zero, the potential of the first terminal 1a' of the NMOS transistor 1', indicated hereinafter as V1', is equivalent to VC1+VDD, whereas the potential of the second terminal 1b' of the NMOS transistor 1', indicated hereinafter as V2', is equivalent to VC2. Between the first and the second terminal 1a' and 1b' of the NMOS transistor 1', there is therefore a positive potential difference equivalent to $\Delta V1=V1'-V2'=VC1+VDD-VC2=VC1+VDD-(VC1+VDD-VTH2)=VTH2$. Since the bulk terminal 1c' is connected to the first terminal 1a' and is therefore also biased to the potential V1', the positive potential difference $\Delta V1$ calculated above is also present between the bulk terminal 1c' and the second terminal 1b', and consequently the PN junction defined by the regions connected to these terminals is biased directly, with possible triggering of the latch-up.

On the other hand, when the potential VA is zero and the potential VB is equivalent to VDD, V1'=VC1 and V2'=VC2+VDD are obtained, and between the first and the second terminal 1a' and 1b' of the NMOS transistor 1', there is a negative potential difference equivalent to $\Delta V2=V1'-V2'=VC1-(VC2+VDD)=VC1-(VC1+VDD-VTH2+VDD)=VTH2-2*VDD$. In this situation, the PN junction defined by the regions connected to the bulk terminal 1c' and to the second terminal 1b' *is biased inversely*.

In some applications, in order to prevent the occurrence of the known body effect, the bulk terminal 1c' of the NMOS transistor 1' is not connected to the first terminal 1a' of the NMOS transistor 1', but is biased via a resistive divider. In particular, in multistage charge pumps, there is provided a resistive divider which consists of n+1 series-connected resistors, in which n is equivalent to the number of charge stages of the charge pump, and is connected between a ground line and a supply line which is set to the potential supplied as output by the charge pump; the NMOS transistor 1' of each charge stage thus has its own bulk terminal 1c' connected to a corresponding intermediate node of the resistive divider.

Figure 1:
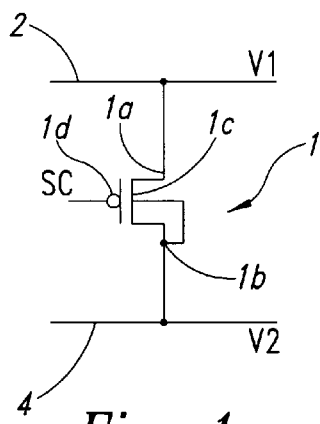
FIG. 1 shows a circuit comprising a PMOS transistor, in which the PN junctions present between the bulk region and the drain and source regions of the PMOS transistor can be biased directly in some operating conditions.

However, in this circuit configuration also, there is a problem similar to that described for the circuit illustrated in FIG. 1. In fact, when the potential VA is equivalent to VDD, and the potential VB is zero, the PN junction defined by the regions connected to the bulk terminal 1c' and to the second terminal 1b' is biased inversely; in this situation, in addition, the bulk terminal 1c' is biased to a potential which is close to that of the second terminal 1b', thus minimizing the body effect.

However, when the potential VA is zero and the potential VB is equivalent to VDD, in particular load conditions the PN junction defined by the regions connected to the bulk terminal 1c' and to the second terminal 1b' could temporarily be biased directly.

Figure 6:
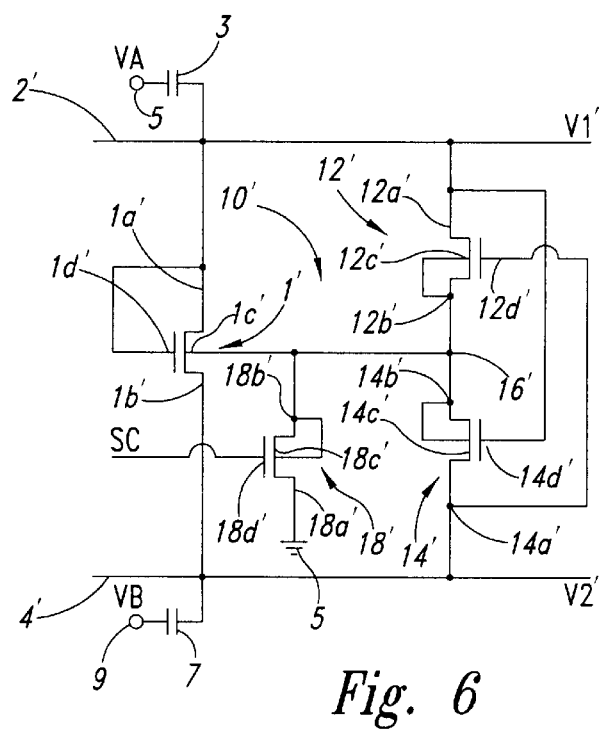
FIG. 6 shows a circuit solution according to the present invention, which can prevent the PN junctions from being biased directly in an NMOS transistor.

FIG. 6 shows a circuit for biasing the bulk terminal of an NMOS transistor according to the present invention.

In particular, the biasing circuit, indicated at 10', has a circuit structure which is very similar to that of the biasing circuit 10, and differs from the latter only in that the transistors used are of the NMOS type, and are indicated by the same reference numbers, followed by the apostrophe "'", as the numbers used to indicate the corresponding PMOS transistors of the biasing circuit 10, as is also the case for the first and the second line 2', 4', and in that the second terminal 18b' of the fourth transistor 18' is connected to a ground node 5 instead of to the second line 4'.

The biasing circuit 10' functions in a manner which is altogether identical to that of the biasing circuit 10, and it will therefore not be described again.

It is only emphasized that depending on the value of the second potential V2', the NMOS transistors 2' and 14' connect the bulk terminal 1c' of the NMOS transistor 1' to the lower potential out of the first and second potentials V1', V2'.

In fact, when the second potential V2' is lower than the first potential V1' by at least a quantity equivalent to the threshold voltage VTH3 of an NMOS transistor, i.e., V2'<V1'−VTH3, the NMOS transistor 14' is on, whereas the NMOS transistor 12' is off, and thus the bulk terminal 1c' of the NMOS transistor 1' is biased to the second potential V2', which is the lower potential present in the circuit. On the other hand, when the second potential V2' is greater than the first potential V1' by at least a quantity equivalent to the threshold voltage VTH3, i.e., V2'>V1'+VTH3, the NMOS transistor 14' is off, whereas the NMOS transistor 12' is on, and therefore the bulk terminal 1c' of the NMOS transistor 1' is biased to the first potential V1', which is the lower potential present in the circuit.

It is also emphasized that the foregoing description applies in general to any MOS transistor, the first and second terminals of which are connected to respective nodes of a circuit which are biased to potentials which can vary during operation, such as to give rise to direct biasing of the PN junctions present between the bulk terminal and the first and second terminal of the MOS transistor.

The advantages which can be obtained from the biasing circuits 10, 10' according to the disclosed embodiments of the present invention, are apparent from an examination of the characteristics of these circuits.

Finally, it is clear that modifications and variants can be made to the biasing circuits 10, 10' described and illustrated here, without departing from the scope of the claims that follow and the equivalents thereof.

For example, the first terminal 18a of the PMOS transistor 18 could be connected to the first line 2, instead of to the second line 4, and the first terminal 18a' of the NMOS transistor 18' could be connected to the second line 4' instead of to ground.

What is claimed is:

1. A circuit comprising a first MOS transistor having a first terminal connected directly to a first node set to a first potential, a second terminal connected to a second node set to a second potential, and a bulk terminal; and
    a biasing circuit, comprising second and third MOS transistors having first terminals connected respectively directly to the first node and to the second node, second terminals connected to o the bulk terminal of said first MOS transistor, and control terminals connected respectively directly to the second and to the first node.

2. The biasing circuit of claim 1, wherein said second and third MOS transistors have bulk terminals connected to the bulk terminal of the first MOS transistor.

3. A circuit comprising a first MOS transistor having a first terminal connected to a first node set to a first potential, a second terminal connected to a second node set to a second potential, and a bulk terminal; and
    a biasing circuit, comprising: second and third MOS transistors having first terminals connected respectively to the first node and to the second node, second terminals connected to the bulk terminal of said first MOS transistor, and control terminals connected respectively to the second and to the first node; and a fourth MOS transistor having a first terminal connected to the first node, a second terminal connected to the bulk terminal of the first MOS transistor, and a control terminal receiving a first control signal.

4. The biasing circuit of claim 3, wherein said fourth MOS transistor has a bulk terminal connected to said bulk terminal of said first MOS transistor.

5. A circuit comprising a first MOS transistor having a first terminal connected to a first node set to a first potential, a second terminal connected to a second node set to a second potential, and a bulk terminal; and
    a biasing circuit, comprising: second and third MOS transistors having first terminals connected respectively to the first node and to the second node, second terminals connected to the bulk terminal of said first MOS transistor, and control terminals connected respectively to the second and to the first node; and a fourth MOS transistor having a first terminal connected to a ground node, a second terminal connected to the bulk terminal of the first MOS transistor, and a control terminal receiving a first control signal.

6. The biasing circuit of claim 5, wherein said fourth MOS transistor has a bulk terminal connected to the bulk terminal of said first MOS transistor.

7. A circuit, comprising:
    a first transistor having a first terminal coupled to a first line that in turn is coupled to a first voltage source, a second terminal connected to a second line that in turn is coupled to a second voltage source, a control terminal coupled to a control signal source, and a body terminal coupled to a first node;
    a second transistor having a first terminal connected to the first line, a second terminal connected to the first node, and a control terminal connected to the second line;
    a third transistor having a first terminal connected to the first node, a second terminal connected to the second line, and a control terminal connected to the first line; and
    a fourth transistor having a first terminal connected to the first node, a second terminal connected to the second line, and a control terminal connected to the control terminal of the first transistor.

8. The circuit of claim 7, wherein the first, second, third, and fourth transistors comprise PMOS transistors.

9. The circuit of claim 8, wherein the body terminals of the second, third, and fourth transistors are coupled to the first node.

10. A circuit, comprising a first transistor having a first terminal coupled to a first line that in turn is coupled to a first voltage source, a second terminal coupled to a second line that in turn is coupled to a second voltage source, a control terminal coupled to the first terminal, and a body terminal coupled to a first node;
    a second transistor having a first terminal coupled to the first line, a second terminal coupled to the first node, and a control terminal coupled to the second line;
    a third transistor having a first terminal coupled to the first node, a second terminal coupled to the second line, and a control terminal coupled to the first line; and
    a fourth transistor having a first terminal coupled to the first node, a second terminal coupled to a ground potential, and a control terminal coupled to a control signal source.

11. The circuit of claim 10, wherein the first line is coupled to a first capacitor that in turn is coupled to a third voltage source, and the second line is coupled to a second capacitor that in turn is coupled to a fourth voltage source.

12. The circuit of claim 10, wherein the first, second, third, and fourth transistors comprise NMOS transistors.

13. The circuit of claim 12, wherein the second, third, and fourth transistors each have a body terminal that is coupled to the first node.

14. A circuit comprising a first MOS transistor having a first terminal connected to a first node set to a first potential, a second terminal connected to a second node set to a second potential, and a bulk terminal; and
    a biasing circuit, comprising: second and third MOS transistors having first terminals connected respectively to the first node and to the second node, second terminals connected to the bulk terminal of said first MOS transistor, and control terminals connected respectively to the second and to the first node; and a fourth MOS transistor having a first terminal connected to the second node, a second terminal connected to the bulk terminal of the first MOS transistor, and a control terminal receiving a first control signal.

15. The biasing circuit of claim 14, wherein said fourth MOS transistor has a bulk terminal connected to said bulk terminal of said first MOS transistor.

16. A circuit, comprising:

a first transistor having a first terminal coupled to a first line that in turn is coupled to a first voltage source, a second terminal connected to a second line that in turn is coupled to a second voltage source, a control terminal coupled to a control signal source, and a body terminal coupled to a first node;

a second transistor having a first terminal connected to the first line, a second terminal connected to the first node, and a control terminal connected to the second line;

a third transistor having a first terminal connected to the first node, a second terminal connected to the second line, and a control terminal connected to the first line; and a fourth transistor having a first terminal connected to the first node, a second terminal connected to a third line that is in turn coupled to a third voltage source with a potential between the potential of the first line and the potential of the second line, and a control terminal connected to the control terminal of the first transistor.

17. The circuit of claim 16, wherein the first, second, third, and fourth transistors comprise PMOS transistors.

18. The circuit of claim 17, wherein the body terminals of the second, third, and fourth transistors are coupled to the first node.

19. A circuit, comprising a first transistor having a first terminal coupled to a first line that in turn is coupled to a first voltage source, a second terminal coupled to a second line that in turn is coupled to a second voltage source, a control terminal coupled to the first terminal, and a body terminal coupled to a first node;

a second transistor having a first terminal coupled to the first line, a second terminal coupled to the first node, and a control terminal coupled to the second line;

a third transistor having a first terminal coupled to the first node, a second terminal coupled to the second line, and a control terminal coupled to the first line; and a fourth transistor having a first terminal coupled to the first node, a second terminal coupled to a third line that is in turn coupled to a third voltage source with a potential between the potential of the second line and a ground, and a control terminal coupled to a control signal source.

20. A circuit, comprising a first transistor having a first terminal coupled to a first line that in turn is coupled to a first voltage source, a second terminal coupled to a second line that in turn is coupled to a second voltage source, a control terminal coupled to the first terminal, and a body terminal coupled to a first node;

a second transistor having a first terminal coupled to the first line, a second terminal coupled to the first node, and a control terminal coupled to the second line;

a third transistor having a first terminal coupled to the first node, a second terminal coupled to the second line, and a control terminal coupled to the first line;

a fourth transistor having a first terminal coupled to the first node, a second terminal coupled to a ground potential, and a control terminal coupled to a control signal source;

a first capacitor having a first terminal coupled to the first line and a second terminal that is coupled to a third voltage source; and a second capacitor having a first terminal coupled to the second line and a second terminal that is coupled to a fourth voltage source.

* * * * *

UNITED STATES PATENT AND TRADEMARK OFFICE
CERTIFICATE OF CORRECTION

| | |
|---|---|
| PATENT NO. | : 6,456,150 B1 |
| APPLICATION NO. | : 09/661601 |
| DATED | : September 24, 2002 |
| INVENTOR(S) | : Andrea Sacco et al. |

Page 1 of 1

It is certified that error appears in the above-identified patent and that said Letters Patent is hereby corrected as shown below:

<u>Column 7, Line 33:</u>
"terminals connected to o the bulk terminal of said first" should read, --terminals connected to the bulk terminal of said first--.

Signed and Sealed this
Seventeenth Day of January, 2012

David J. Kappos
*Director of the United States Patent and Trademark Office*